(12) United States Patent
Torok et al.

(10) Patent No.: US 6,485,311 B2
(45) Date of Patent: Nov. 26, 2002

(54) COMPRESSION CONNECTOR ACTUATION SYSTEM

(75) Inventors: John G. Torok, Poughkeepsie, NY (US); Gary F. Goth, Pleasant Valley, NY (US); John J. Loparco, Poughkeepsie, NY (US); Kent D. Waddell, West Hurley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/812,317

(22) Filed: Mar. 20, 2001

(65) Prior Publication Data

US 2002/0137367 A1 Sep. 26, 2002

(51) Int. Cl.$^7$ .......................... H01R 12/00; H05K 1/00; H05K 7/10; H05K 7/12
(52) U.S. Cl. .......................................... 439/73; 361/767
(58) Field of Search ........................... 439/73, 66, 264; 361/767, 768

(56) References Cited

U.S. PATENT DOCUMENTS

| | | | |
|---|---|---|---|
| 4,445,735 A | * | 5/1984 | Bonnefoy ..................... 439/66 |
| 5,468,158 A | * | 11/1995 | Roebuck et al. ............. 439/264 |
| 5,473,510 A | * | 12/1995 | Dozier, II .................... 174/52.4 |
| 5,528,462 A | * | 6/1996 | Pendse ......................... 361/767 |
| 5,623,394 A | | 4/1997 | Sherif et al. |
| 5,770,891 A | | 6/1998 | Frankeny et al. |
| 5,883,788 A | * | 3/1999 | Ondricek et al. ............ 361/768 |
| 5,940,278 A | | 8/1999 | Schumacher |
| 5,989,039 A | | 11/1999 | Sik |
| 5,997,316 A | | 12/1999 | Kunzel |
| 6,014,315 A | | 1/2000 | McCullough et al. |
| 6,022,225 A | | 2/2000 | Chapin et al. |
| 6,114,757 A | | 9/2000 | DelPrete |

OTHER PUBLICATIONS

Typical Connector, date unknown.
Typical Actuation Hardware System, date unknown.

* cited by examiner

*Primary Examiner*—Khiem Nguyen
*Assistant Examiner*—Chandrika Prasad
(74) *Attorney, Agent, or Firm*—Cantor Colburn LLP; Floyd Gonzalez

(57) ABSTRACT

An exemplary embodiment of the invention is an actuation system including a printed circuit board having a plurality of interconnects and a compression connector positioned adjacent the printed circuit board and having a plurality of contacts for engaging the interconnects. A processing module is positioned adjacent the compression connector. The processing module has a base and a plurality of terminals for engaging contacts on the compression connector. An actuator includes a fastener that engages the base of the processing module and a biasing member for maintaining a force on the compression connector.

12 Claims, 4 Drawing Sheets

COMPRESSION CONNECTOR ACTUATION SYSTEM

BACKGROUND OF THE INVENTION

The invention relates to an actuation system for a compression connector. The continuous development in the electronics and computer industry has resulted in larger processing modules being packaged in smaller spatial environments. Coupled with this increase is a need to connect an increased number of processing module input/output terminals to printed circuit boards. One device for interconnecting a high number of input/output terminals on a processing module to a printed circuit board is a land grid array (LGA). Typically, a LGA is sandwiched between the processing module and the printed circuit board to provide electrical connection between the terminals on the processing module and interconnects (e.g., pads, plated vias, etc) on the printed circuit board.

Existing designs apply force over the precessing module to maintain electrical contact between the processing module, the LGA and the printed circuit board. This force may be derived from a device that rests on the top of the processing module. A drawback to such designs is that placement of a force applying device on top of the processing module interferes with the ability to cool the processing module. The force applying device takes up space that may be used for heat sinks and may prevent use of more sophisticated cooling techniques such as refrigeration and/or evaporative cooling.

SUMMARY OF THE INVENTION

An exemplary embodiment of the invention is an actuation system including a printed circuit board having a plurality of interconnects and a compression connector positioned adjacent the printed circuit board and having a plurality of contacts for engaging the interconnects. A processing module is positioned adjacent the compression connector. The processing module has a base and a plurality of terminals for engaging contacts on the compression connector. An actuator includes a fastener that engages the base of the processing module. The actuator also includes a biasing member for maintaining a force on the compression connector.

DETAILED DESCRIPTION

Figure 1:
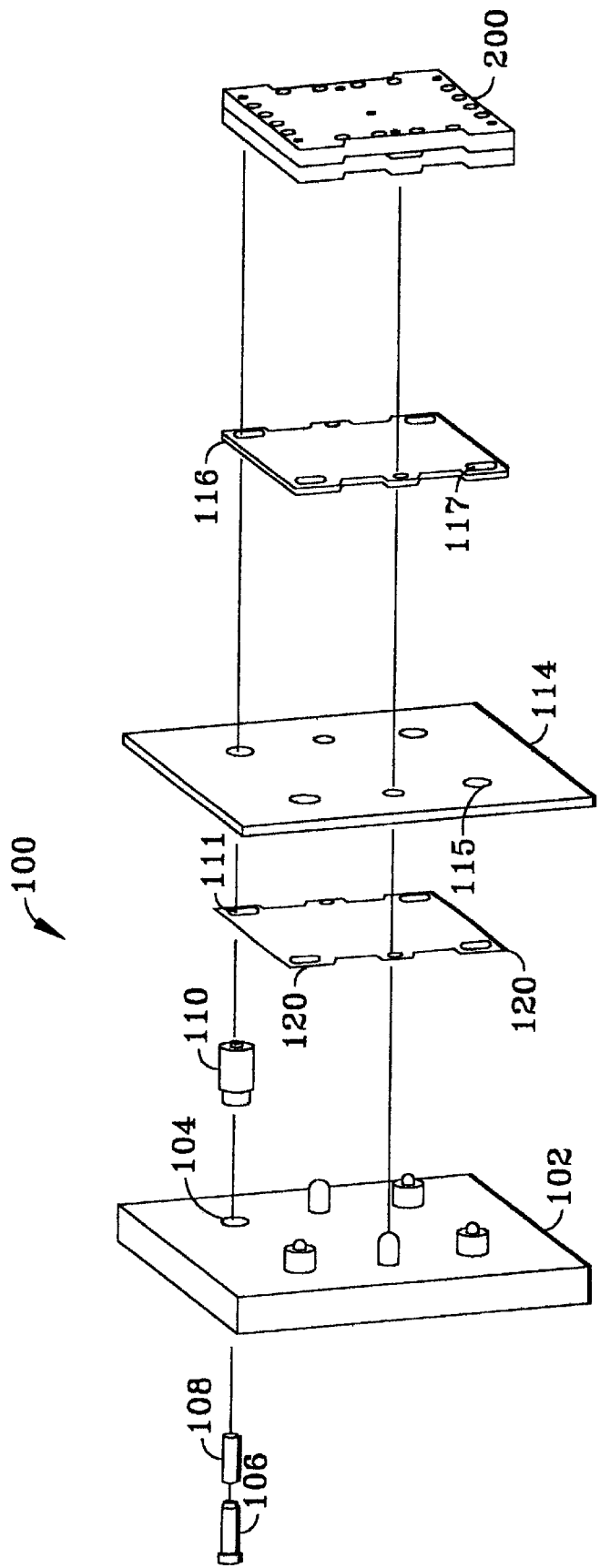
FIG. 1 is an exploded perspective view of a compression connector actuation device and a processing module in an embodiment of the invention.

FIG. 1 is an exploded perspective view of a compression connector actuation device 100 and a processing module 200. The compression connector actuation device 100 includes a backing plate 102 having a plurality of holes 104 formed therethroagh. The backing plate 102 may made from metal or a reinforced non-metallic material. Each hole 104 receives an actuator made up of a fastener 106, a biasing member (e.g. a compression spring) 108 and sleeve 10. As described in further detail herein the actor secures the processing module 200 to the actuation device 100 and provides a compressive force. Moreover, as shown in FIG. 1 the backing Plate reinforces both the PCB 114 and the actuation device 100.

An insulator 120 is positioned between the backing plate 102 and a printed circuit board (PCB) 114. The insulator 120 prevents circuit traces on the bottom of PCB 114 from making electrical contact with the backing plate 102 to prevent shorting. Insulator 120 includes openings 111 for passing the sleeve 110 and fastener 106.

The top of PCB 114 includes a pattern of interconnects (e.g., pads, plated vias, etc.) that corresponds to a pattern of contacts on compression connector 116. In an exemplary embodiment, compression connector 116 is a LGA including an array of contacts (e.g., inter-twined balls of gold wire) arranged in a pattern matching a pattern of terminals on the bottom of processing module 200. Compression connector 116 may use other interconnect techniques such as ball grid array (BGA) and generally may employ any compression-based electrical connection technique. The PCB 114 may include leads from the interconnects to other portions of the PCB 114 for interfacing with the processing module 200. As described in further detail herein, the compression connector 116 provides an electrical connection between the processing module 200 and the PCB 114. PCB 114 includes openings 115 for passing sleeve 110 and fastener 106. Similarly, compression connector 116 includes openings 117 for passing sleeve 110 and fastener 106.

Figure 2:
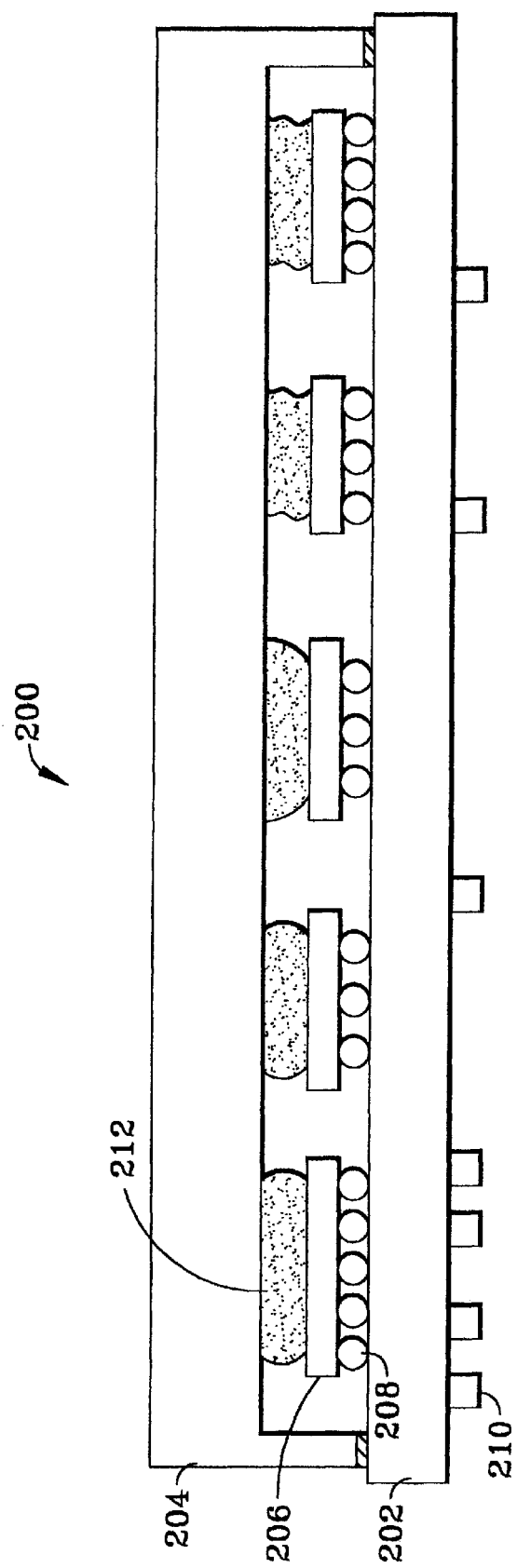
FIG. 2 is a cross-sectional view of an exemplary processing module.

The processing module 200 may be a, multi-chip module (MCM) such as that shown in cross-section in FIG. 2. As shown in FIG. 2, the processing module 200 includes a base 202 and a cover 204. Housed between the base 202 and cover 204 are a plurality of processors 206. Each processor has input/output leads 208 that are electrically connected to processing module input/output terminals 210 on the bottom of the processing module 200. The terminals 210 may be implemented using a variety of structures such as pads, balls, pins, etc. The pattern of contacts on compression connector 116 corresponds to the pattern of terminals 210 on the bottom of processing module 200.

Each processor 206 may be in thermal communication with cover 204 through thermally conductive compounds 212. In this manner, heat from each processor 206 may be dissipated through the thermally conductive compound 212 and cover 204. Such dissipation may occur by placing heat sinks on cover 204. More sophisticated cooling devices, such as refrigerant based coolers, may be placed in thermal communication with cover 204. Accordingly, preserving space on cover 204 increases the ability to cool processors 206.

Figure 3:
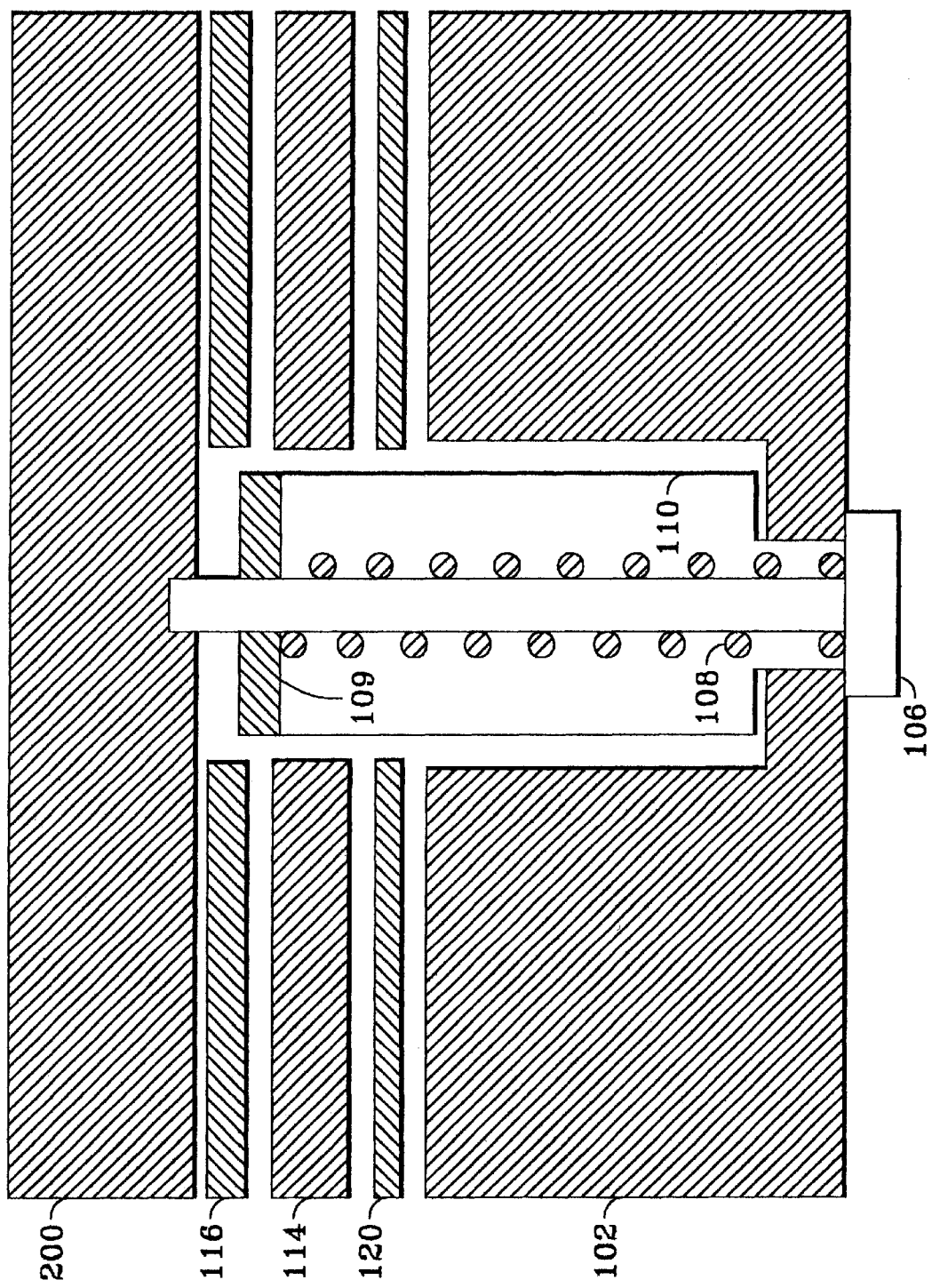
FIG. 3 is a cross-sectional view of a portion of the compression connector sly actuation device and a processing module.

The actuation device 100 connects with processing module 200 so as to minimally interfere with the outside surface, and primarily cover 204, of processing module 200. FIG. 3 is a cross-sectional view depicting a portion of actuation device 100 connected to the processing module 200. The contacts of compression connector 116 and interconnects of PCB 114 are not shown. It is understood that the contacts of the compression connector 116 engage the terminals 210 of the processing module 200 and the interconnects on the PCB 114 to establish electrical connection therebetween. As shown in FIG. 3, one end of sleeve 110 is threaded and secured to the bottom of the backing plate 102. Fastener 106 extends through the sleeve 110 and extends past a distal end of sleeve 110. The head of fastener 106 is larger than opening 104. Spring 108 is contained within sleeve 110 by a collar 109 having an opening sized to pass fastener 106 but not spring 108. The sleeve 110 and fastener 106 pass through openings 111 in insulator 120, openings 115 in PCB 114 and openings 117 in compression connector 116. The distal end of sleeve 110 may be distanced from the base 202 of processing module 200 and fastener 106 is secured to the base 202 of processing module 200 through a thread on fastener 106.

On initial assembly, the fastener 106 is tightened to a predetermined torque to apply pressure compressing the PCB 114, compression connector 116 and processing module 200. This results in an electrical connection between the processing module 200 and the PCB 114 through compression connector 116. Spring 108 maintains a constant loading on the compression connector 116. The floating nature of the components relative to the sleeve 100 and base 102 allows the spring 108 to accommodate for thickness variations of the insulator 120, PCB 114 compression connector 116 and processing module 200. The 106 fastener and the biasing member 108 do not spatially impose beyond the cover surface of the processing module.

Figure 4:
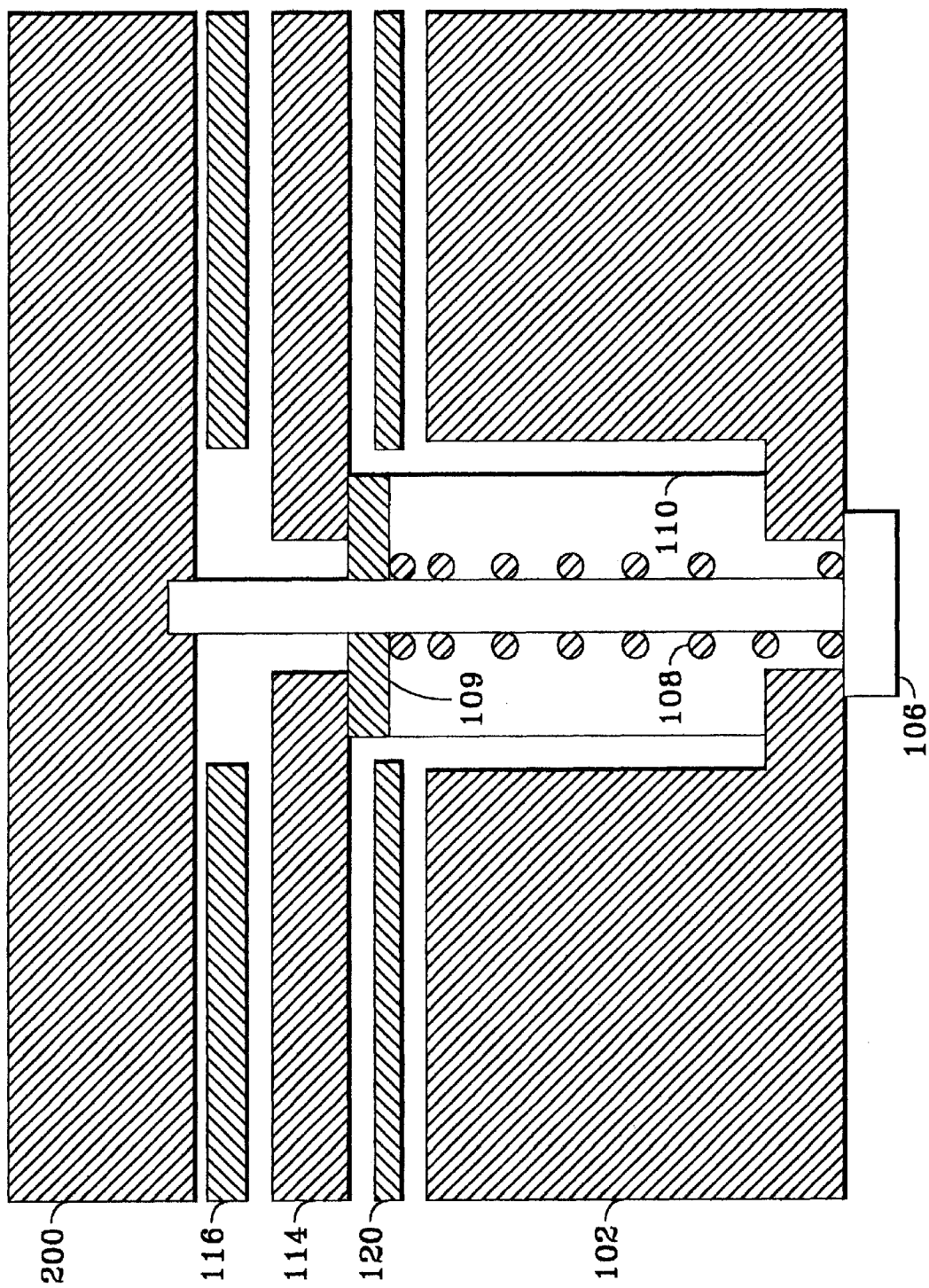
FIG. 4 is a cross-sectional view of a portion of the compression connector actuation device and a processing module in an alternate embodiment.

FIG. 4 depicts an alternate embodiment in which the sleeve 110 is not secured to the base 102. In this embodiment, the sleeve 110 has an outer dimension greater than opening 115 in PCB 114. Thus, the sleeve 110 applies force on the bottom of PCB 114 through spring 118. Fastener 106 engages base 202 to provide initial compression of the compression connector 116. Spring 108 maintains compression over the compression connector 116 as described above.

As shown in FIGS. 3 and 4, the cover 204 of the processing module 200 is entirely accessible thereby providing a surface for cooling the processing module. Thus, the actuation device 100 provides for use of compression connectors while not inhibiting the ability to cool the processing module.

While exemplary embodiments have been shown and described, various modifications and substitutions may be made thereto without departing from the spirit and scope of the invention. Accordingly, it is to be understood that the present invention has been described by way of illustration and not limitation.

What is claimed is:

1. An actuation system, comprising:
   a backing plate,
   a printed circuit board positioned adjacent said backing plate, said printed circuit board having a plurality of interconnects;
   a compression connector positioned adjacent said printed circuit board, said compression connecter having a plurality of electrical contacts, said contacts for engaging said printed circuit board interconnects and for engaging processing modally terminals;
   a processing module positioned adjacent said compression connector, said processing module having a base and a cover, said base and cover enclosing at least one processor, said processing module having a plurality of terminals, said terminals for engaging said compression connector contacts;
   at least one actuator including a fastener and a biasing member, said fastener and said biasing member positioned beneath said base so as to not spatially impose beyond said cover of said processing module, and said biasing member maintaining a compressive force on said compression connector; and,
   a printed circuit board opening formed in said printed circuit board, said actuator passing through said printed circuit board opening.

2. The actuation system of claim 1 wherein said biasing member is a spring.

3. The actuation system of claim 1 wherein said backing plate provides support for said actuator.

4. The actuation system of claim 3 wherein said actuator includes a sleeve secured to said backing plate, said biasing member being positioned within said sleeve and in contact with an end of said sleeve, said fastener passing through said sleeve, said biasing member contacting a head of said fastener.

5. The actuation system of claim 4 wherein said biasing member applies force against said fastener to draw said processing module against said compression connector.

6. The actuation system of claim 3 further comprising an insulator positioned between said printed circuit board and said backing plate.

7. An actuation system, comprising:
   a backing plate,
   a printed circuit board positioned adjacent said backing plate, said printed circuit board having a plurality of interconnects;
   a compression connector positioned adjacent said printed circuit board, said compression connector having a plurality of electrical contacts, said contacts for engaging said printed circuit board interconnects and for engaging processing module terminals;
   a processing module positioned adjacent said compression connector, said processing module having a base and a cover, said base and cover enclosing at least one processor, said processing module having a plurality of terminals, said terminals for engaging said compression connector contacts;
   at least one actuator including a fastener and a biasing member, said fastener and said biasing member positioned beneath said base so as to not spatially impose beyond said cover of said processing module, and said biasing member maintaining a compressive force on said compression connector; and,
   a compression connector opening formed in said compression connector, said actuator passing through said compression connector opening.

8. The actuation system of claim 7 wherein said biasing member is a spring.

9. The actuation system of claim 7 wherein said backing plate provides support for said actuator.

10. The actuation system of claim 9 wherein said actuator includes a sleeve secured to said backing plate, said biasing member being positioned within said sleeve and hi contact with an end of said sleeve, said fastener passing through said sleeve, said biasing member contacting a head of said fastener.

11. The actuation system of claim 10 wherein said biasing member applies force against said fastener to draw said processing module against said compression connector.

12. The actuation system of claim 9 further comprising an insulator positioned between said printed circuit board and said backing plate.

* * * * *